United States Patent [19]
Eatwell et al.

[11] Patent Number: 5,768,473
[45] Date of Patent: Jun. 16, 1998

[54] ADAPTIVE SPEECH FILTER

[75] Inventors: Graham P. Eatwell, Caldecote, Canada; Kenneth P. Davis, Silver Spring, Md.

[73] Assignee: Noise Cancellation Technologies, Inc., Linthicum, Md.

[21] Appl. No.: 380,528

[22] Filed: Jan. 30, 1995

[51] Int. Cl.$^6$ .................. G10L 3/02; G10L 9/00
[52] U.S. Cl. .................. 395/2.35; 345/2.37; 381/94
[58] Field of Search ................ 395/2.35, 2.36, 395/2.37, 2.34, 2.14; 381/94, 46, 47, 68.2, 68.4, 68

[56] References Cited

U.S. PATENT DOCUMENTS

| | | | |
|---|---|---|---|
| 3,403,224 | 9/1968 | Schroeder | 395/2.35 |
| 3,431,355 | 3/1969 | Rothauser et al. | 395/2.35 |
| 3,855,423 | 12/1974 | Brendzel et al. | 395/2.35 |
| 4,000,369 | 12/1976 | Paul, Jr. et al. | 395/2.37 |
| 4,025,721 | 5/1977 | Graupe et al. | 395/2.36 |
| 4,185,168 | 1/1980 | Graupe et al. | 381/94 |
| 4,628,529 | 12/1986 | Borth et al. | 381/94 |
| 4,630,305 | 12/1986 | Borth et al. | 381/94 |
| 4,811,404 | 3/1989 | Vilmur et al. | 381/94 |
| 4,852,175 | 7/1989 | Kates | 381/68 |
| 5,012,519 | 4/1991 | Adlersberg et al. | 395/2.35 |
| 5,412,735 | 5/1995 | Engebretson et al. | 381/68.4 |
| 5,485,522 | 1/1996 | Solve et al. | 381/56 |

OTHER PUBLICATIONS

Ephraim Y., Malah D., "Speech Enhancement Using a Minimum Mean–Square Error Short–Time Spectral Amplitude Estimator", IEEE Transactions on Acoustics, Speech and Signal Processing, vol. ASSP–32, No. 6, Dec. 1984.

Boll S., "Suppression of Acoustic Noise in Speech Using Spectral Substraction", IEEE Transactions on Acoustics, Speech, and Signal Processing, vol. ASSP–27, No. 2, Apr. 1979.

Weiss M., et al. "Processing Speech Signals to Attenuate Interference" IEEE Symposium on Speech Recognition, Carnegie–Mellon University, Apr. 15–19, 1974.

*Primary Examiner*—Allen R. MacDonald
*Assistant Examiner*—Patrick N. Edouard

[57] ABSTRACT

This invention relates to an improved adaptive spectral estimator for estimating the spectral components in a signal containing both an information signal, such as speech and noise. The improvements relate to a noise power estimator and a computationally efficient gain calculation method. The adaptive spectral estimator is particularly suited to implementation using digital signal processing and can be used to provide improved spectral estimates of the information signal. It can be combined with a speech or voice recognition system. A further object of the invention is to provide an accurate method for voice detection.

16 Claims, 4 Drawing Sheets

ADAPTIVE SPEECH FILTER

FIELD OF THE INVENTION

This invention relates to a method and system for improving the estimates of the spectral components of an information signal, such as speech, from a signal containing both the information signal and noise. The method is particularly suited to implementation on a digital signal processor. The invention also provides the basis for signal enhancement and improved detection of the presence of an information signal.

BACKGROUND OF THE INVENTION

The spectral components of an information signal are used in a number of signal processing systems including channel vocoders for communication of speech, speech recognition systems and signal enhancement filters. Since the inputs to these systems are often contaminated by noise there has been a great deal of interest in noise reduction techniques.

The effect of uncorrelated noise is to add a random component to the power in each frequency band.

Noise free spectral components are required for channel vocoders. In a vocoder the input signal is filtered into a number of different frequency bands and the signal from each band is rectified (squared) and smoothed (low pass filtered). The smoothing process tends to reduce the variance of the noise. Such methods are disclosed in U.S. Pat. No. 3,431,355 to Rothauser et al and U.S. Pat. No. 3,431,355 to Schroeder. An alternative approach is disclosed in U.S. Pat. No. 3,855,423 to Brendzel et al. in this approach the level of the noise in each band is estimated from successive minima of the energy in that band and the level of the signal is estimated from successive maxima. In U. S. Pat. No. 4,000, 369 to Paul et al. the noise levels are estimated in a similar fashion and subtracted from the input signals to obtain a better estimate of the speech signal in each band. This method reduces the mean value of the noise.

Another application of spectral processing is for speech filtering. Weiss et al., in "Processing Speech Signals to Attenuate Interference", presented at the IEEE Symp. Speech Recognition, April 1974, disclose a spectral shaping technique. This technique uses frequency domain processing and describes two approaches —amplitude modulation (which is equivalent to gain control) and amplitude clipping (which is equivalent to a technique called spectral subtraction). Neither the noise estimate nor the speech estimate is updated so this filter is not adaptive. An output time waveform is obtained by recombining the spectral estimates with the original phases.

An adaptive speech filter is disclosed in U.S. Pat. No 4,185,168 to Graupe and Causey, which is included by reference herein. Graupe and Causey describe a method for the adaptive filtering of a noisy speech signal based on the assumption that the noise has relatively stationary statistics compared to the speech signal.

In Graupe and Causey's method the input signal is divided into a set of signals limited to different frequency bands. The signal to noise ratio for each signal is then estimated in accordance with the time-wise variations of its absolute value. The gain of each signal is then controlled according to an estimate of the signal to noise ratio (the gain typically being close to unity for high signal to noise ratio and less than unity for low signal to noise ratio).

Graupe and Causey describe a particular method for estimating the noise power from successive minima in the signals, and describe several methods for determining the gain as a function of the estimated noise and signal powers. This is an alternative to the method described earlier in U.S. Pat. No. 4,025,721 to Graupe and Causey, which detects the pauses between utterances in the input speech signal and updates estimates of the noise parameters during these pauses. In U.S. Pat. No. 4,025,721, Graupe and Causey describe the use of Wiener and Kalman filters to reduce the noise. These filters can be implemented in the time domain or the frequency domain.

Boll, in "Suppression of Acoustic Noise in Speech using Spectral Subtraction", IEEE Transactions on Acoustics, Speech and Signal Processing. Vol. ASSP-27, No. 2, April 1979, describes a computationally more efficient way of doing spectral subtraction.

In the spectral subtraction technique, used by Paul, Weiss and Boll, a constant or slowly-varying estimate of the noise spectrum is subtracted. However, successive measurements of the noise power in each frequency bin vary rapidly and only the mean level of the noise is reduced by spectral subtraction. The residual noise will depend upon the variance of the noise power. This is true also of Weiss's spectral shaping technique where the spectral gains are constant. In Graupe's method the gain applied to each bin is continuously varied so that both the variance and the mean level of the noise can be reduced.

There are many schemes for determining the spectral gains. One scheme is described by Ephraim and Malah in "Speech enhancement using a minimum mean-square error short-time spectral amplitude estimator", IEEE Transactions on Acoustics, Speech and Signal Processing, Vol. ASSP-32, No. 6, Dec. 1984. This describes a technique for obtaining two estimates of the signal to noise ratio —one from the input signal and one from the output signal. It does not update the estimate of the noise level. The gain is a complicated mathematical function of these two estimates, so this method is not suitable for direct implementation on a digital processor.

In U.S. Pat. No. 5,012,519 to Aldersburg et al the gain estimation technique of Ephraim and Malah is combined with the noise parameter estimation method disclosed in U.S. Pat. No. 4,025,721 to Graupe and Causey to provide a fully adaptive system. The mathematical function of Ephraim and Malah is replaced with a two-dimensional lookup table to determine the gains. However, since the estimates of the signal to noise ratio can vary over a very large range, this table requires a large amount of expensive processor memory. Aldersburg et al use a separate voice detection system on the input signal which requires significant additional processing.

There is therefore a need for an efficient adaptive signal enhancement filter suitable for implementation on an inexpensive digital signal processor.

There is also a need for a robust noise estimator which can cope with changes in the noise characteristics.

There is also a need for an efficient signal detection system.

SUMMARY OF THE INVENTION

This invention relates to an improved adaptive spectral estimator for improving the estimates of the spectral components in a signal containing both an information signal, such as speech or music, and noise. The improvements relate to a noise power estimator and a computationally efficient gain calculation method. The adaptive spectral estimator is particularly suited to implementation using digital signal processing. The estimator can be used to provide improved spectral estimates of the information signal and can be combined with a speech or voice recognition system. A further object of the invention is to provide an accurate method for voice detection.

BRIEF DESCIRPTION OF THE DRAWINGS

DESCRIPTION OF THE PREFERRED EMBODIMENT

The method is a modified version of that described in U.S. Pat. No. 4,185,168 to Graupe and Causey which describes a method for the adaptive filtering of a noisy speech signal. The method is based on the assumption that the noise has relatively stationary statistics compared to the speech signal.

The input to the filter is usually a digital signal obtained by passing an analog signal, containing noise and the information signal, through high- and low-pass filters and then sampling the resulting signal at a sample rate of at least 8 kHz. The high pass filter is designed to remove low frequency noise which might adversely affect the dynamic range of the filter. The turnover frequency of the high pass filter is less then $f\_low$, where $f\_low$ is the lower limit of the speech band in Hertz. The low pass filter is an anti-aliasing filter which has a turnover frequency of at least $f\_high$, where $f\_high$ is the upper limit of the speech band in Hertz. The order of the low pass filter is determined by the sampling frequency and the need to prevent aliasing.

The output signal is calculated by filtering the input signal using a frequency domain filter with real coefficients and may be a time series or a set of spectral estimates.

If the output is a time series then it may be passed to a digital to analog converter (DAC) and an analog anti-imaging filter to produce an analog output signal or it may be used as an input to subsequent signal processing.

The estimator of the spectral components comprises four basic steps

1. Calculation of the spectrum of the input signal.
2. Estimation of the signal and noise power in each frequency bin within the speech band ($f\_low \rightarrow f\_high$ Hz).
3. Calculation of the gains (coefficients) of the frequency domain filter for each frequency bin
4. Calculation of the spectral estimates by multiplying each input spectral component by the corresponding gain.

Figure 1:
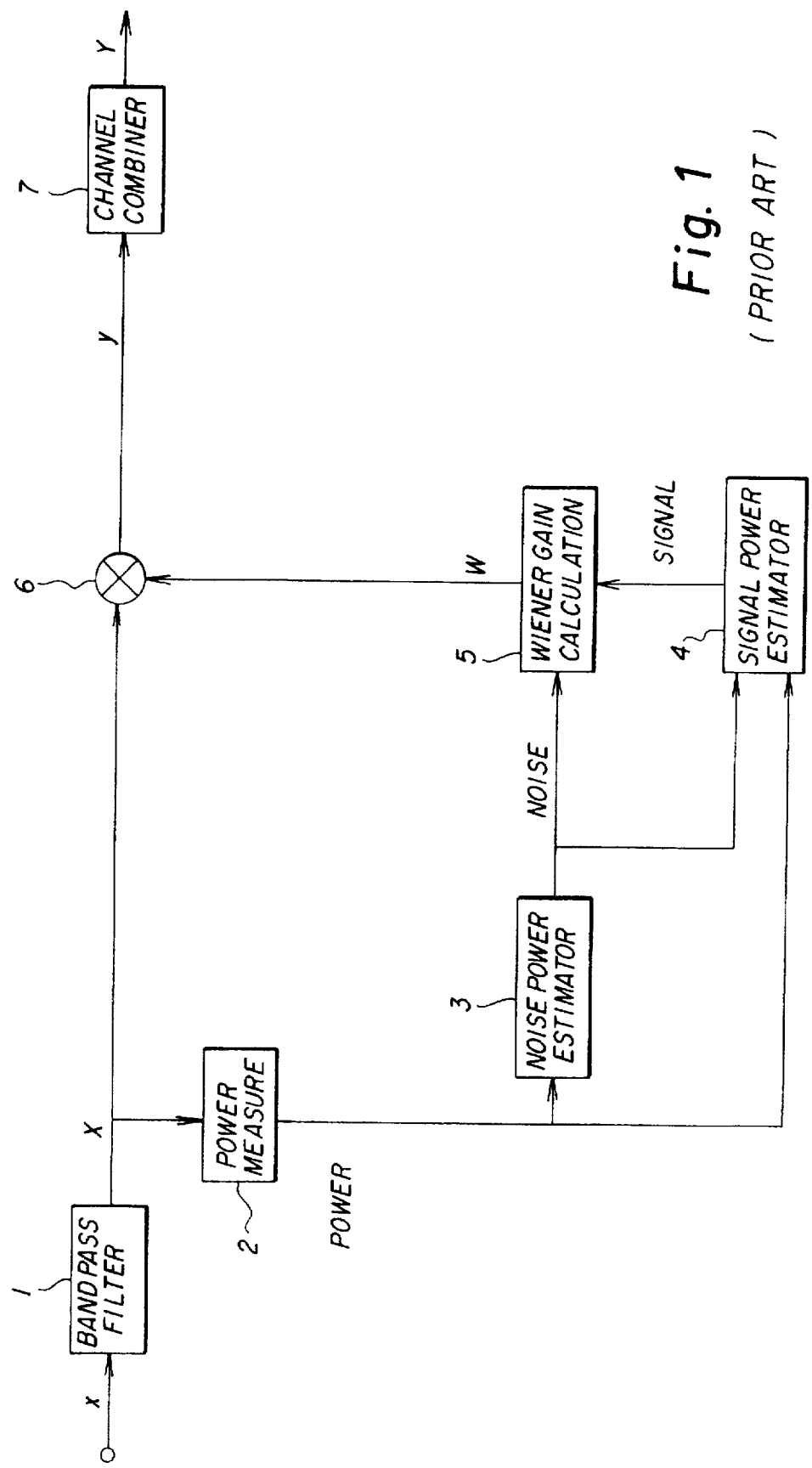
FIG. 1 is a diagrammatic view of a system of the prior art.

This is basically the method of Graupe and Causey which is summarized in FIG. 1. Each of the processes is described in detail below.

The spectral components of the input signal can be obtained by a variety of means, including band pass filtering and Fourier transformation. In one embodiment a discrete or fast Fourier transform is used to transform sequential blocks of N points of the input time series. A window function, such as a Hanning window, can be applied, in which case an overlap of N/2 points can be used. A Discrete Fourier Transform (DFT) can be used at each frequency bin in the speech band or, alternatively, a Fast Fourier Transform (FFT) can be used over the whole frequency band. The spectrum is stored for each frequency bin within the speech band. For some applications it is desirable to have unequally spaced frequencies—in these applications a Fast Fourier transform cannot be used and each component may have to be calculated independently. In one embodiment the input spectrum, X, is calculated as the Fourier transform of the input time series, x, namely $$X = \text{Fourier transform}\{x, \text{window function}, N\}.$$

The power in the input spectrum is given by $$\text{power} = \text{modulus squared}\{X\}.$$

Alternatively, a band pass filter may be used, in which case the power may be estimated by rectifying and smoothing the filter output.

The system of Graupe and Causey is shown in FIG. 1.

The input signal, x, is passed to bank of band pass filters. One of these filters 1 is shown in FIG. 1. This produces an input component X The power of this component is measured at 2.

The method requires that estimates are made of the signal power, signal, and noise power, noise. The noise power is estimated in 3 with a time constant related to the time over which the noise can be considered stationary. The signal is estimated at 4. From these estimates the Wiener filter gain, W, is calculated as the ratio of the power in the information signal to the total power. This is done at 5 in FIG. 1. For each frequency bin this is $$W = \text{signal}/(\text{noise} + \text{signal}).$$

In the method of Graupe and Causey the Wiener gain, W, is directly applied to the corresponding component of the input spectrum. In the unmodified scheme the spectral components of the output are given by multiplying the input component by the gain at 6 in FIG. 1. The result is $$Y = W \cdot X$$

If the output time series, y, is required it can be calculated by an inverse FFT (or DFT) and the 'overlap-add' method or by summing the components from individual channels using channel summer 7 in FIG. 1.

After each iteration k the output block of N time points is updated as $$y_k(1:N) = \text{inverse Fourier transform}\{Y,N\}$$

$$y_k(1:N/2) = y_k(1:N/2) + y_{k-1}(N/2+1:N)$$

The first N/2 points of $y_k$ are then sent to the DAC or may be used for further processing.

Figure 2:
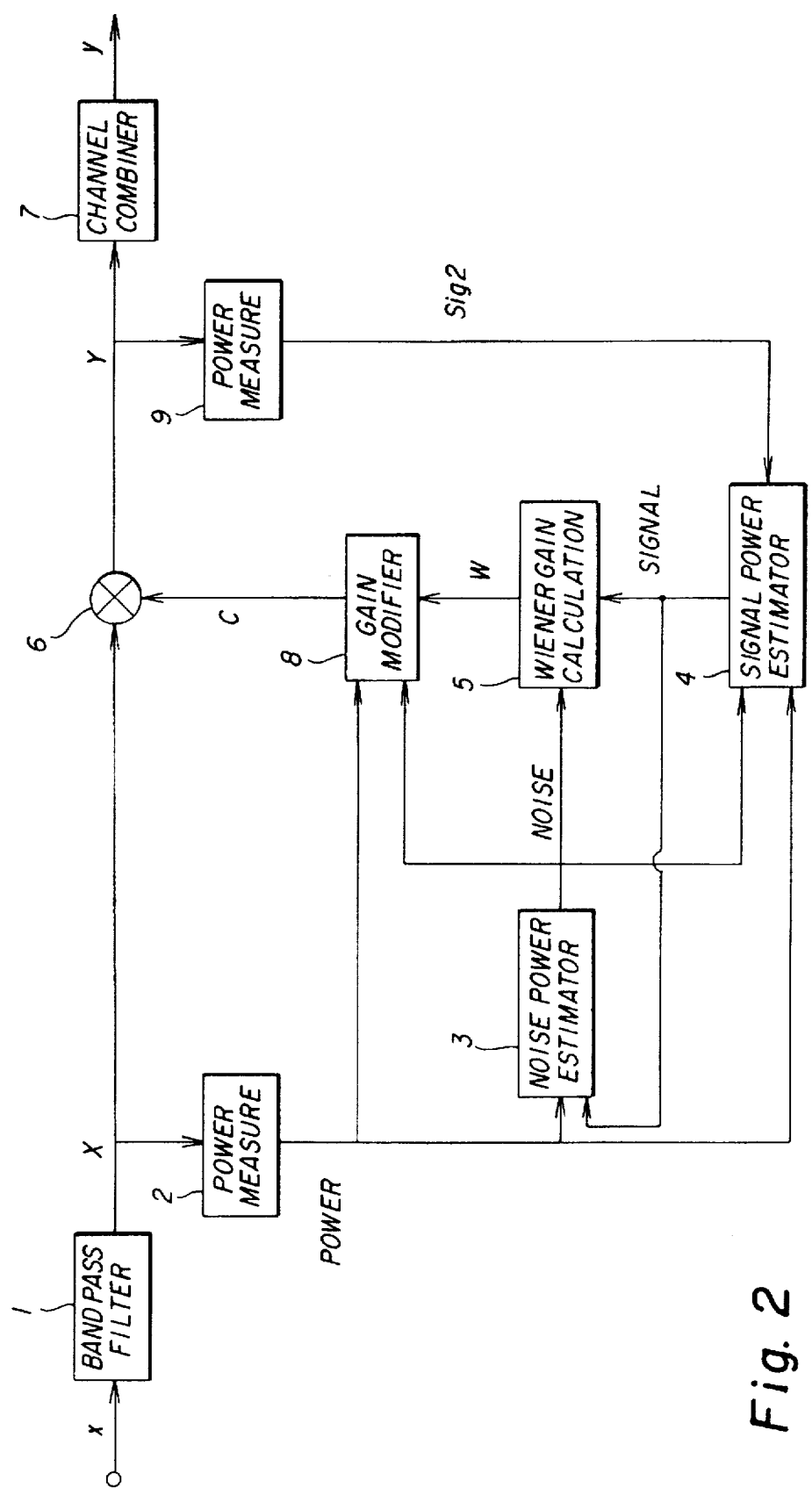
FIG. 2 is a diagrammatic view of a system of the current invention.

An improved system of the current invention is shown in FIG. 2. The additional features are described below.

Gain Modification

When the signal to noise ratio is low the direct use of the Wiener gain results in a residual noise which has a musical or artificial character.

Figure 3:
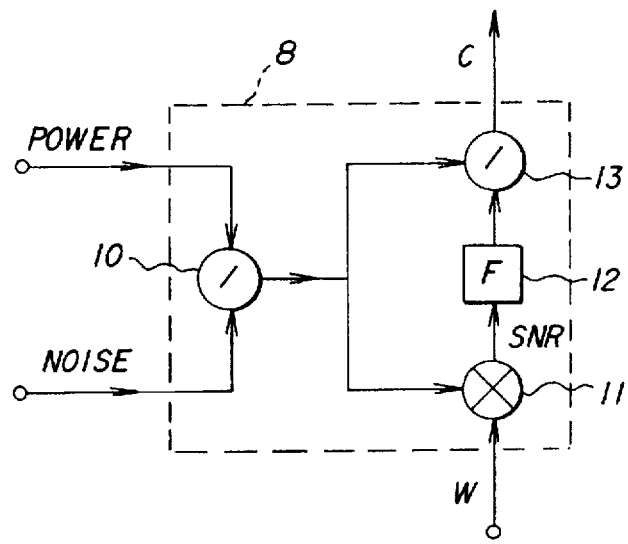
FIG. 3 is a diagrammatic view of a system for gain modification.

One improvement of the current invention is the use of gain modifier, 8 in FIG. 2, which reduces the musical nature of the residual noise. The gain modifier, which is shown in FIG. 3, will now be described.

The instantaneous power of the information signal can be estimated as the product of the instantaneous power and the Wiener gain. This gives an estimate of the instantaneous signal to noise ratio, snr, in each frequency bin obtained by dividing the power by the noise at 10 in FIG. 3, and using this to modulate or multiply the Wiener gain at 11. Hence snr=W*(power/noise).

A function of the signal to noise ratio is then calculated at 12. The modified filter gains (coefficients), which are denoted by the vector C, are calculated by dividing this function of the signal to noise ratio by the ratio of the power to the noise at 13. This is done for each frequency, so that C=F{snr}*(noise/power)=F{snr}/(power/noise)

where F is a function of a single variable and is therefore well suited to implementation on a DSP as a look-up table or an analytic function. One form of the function F is given by $$F(x) = \begin{cases} x^{1/2}, & x < snr0 \\ x+c, & x \geq snr0 \end{cases}$$

where c and snr0 are constants. Other forms can used, but it is desirable that the function is approximately linear at high signal to noise ratios. In particular the gain of Ephraim and Malah may be manipulated so that it can be implemented in this form.

The spectral output, Y, that is the estimate of the spectrum of the information signal, is calculated by multiplying the input spectral components by the corresponding modified gains 6 in FIG. 2., so that for each frequency

Y=C*X

Signal Estimation

Figure 4:
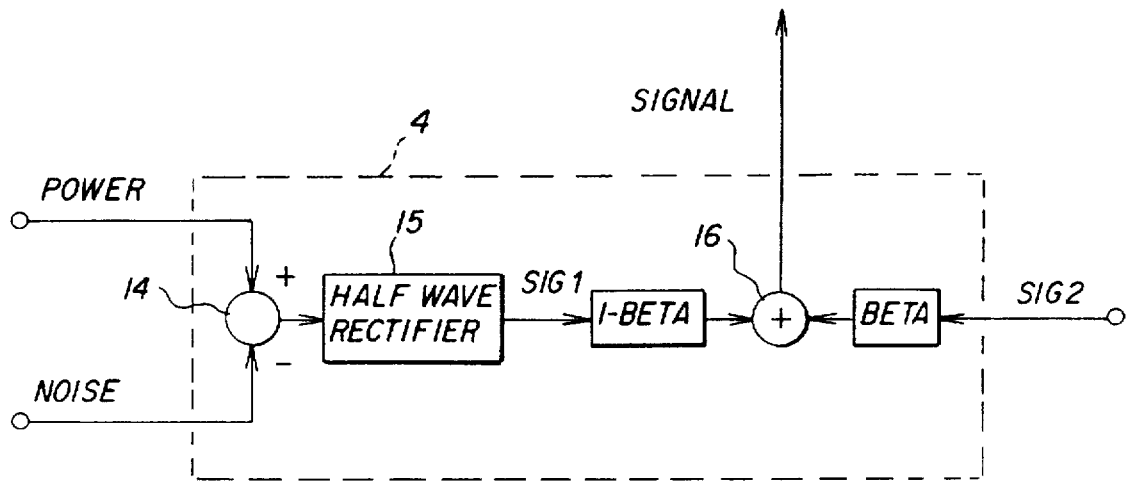
FIG. 4 is a diagrammatic view of a system for signal power estimation.

Ephraim and Malah describe a method for updating a signal to noise ratio. This method can be modified to give an estimate of the signal power, signal. This signal estimator (4 in FIG. 2) uses the power in the output signal calculated at 9 in FIG. 2. The method is shown in detail in FIG. 4 and is given by sig1=maximum{power−noise, 0} sig2=modulus squared{Y} signal=(1-beta)*sig1+beta*sig2

The difference between the current total power and the estimate of the noise is calculated at 14. This signal is then half wave rectified at 15. The signal estimate is obtained as a weighted sum 16 of this rectified signal and the power in the output signal. The weighting parameter beta used in the weighted sum is typically chosen to be greater than 0.9 and less than 1.

Noise Estimation

The estimates of the noise can be updated during the pauses in the information signal. The pauses can be detected by looking at a weighted sum of the signal to noise components across frequency bins (a uniform weighting may be used). If this weighted sum is below a predetermined threshold, Smin say, the noise estimate at each frequency is updated as noise=noise+alpha*maximum{power−noise, 0} where alpha is a parameter which determines the time constant of the estimate. alpha is typically chosen to be greater than 0.9 and less than 1.

An alternative noise estimator may be obtained by using the assumption that the information signal and the noise signal are uncorrelated. The signal power can be estimated from the output components, Y, and subtracted from the total power old_power from the previous update. That is temp=alpha*(old_power[f]−signal)

noise=(1-alpha)*noise+alpha*sign{temp}*minimum{abs(temp), noise/2}

Figure 5:
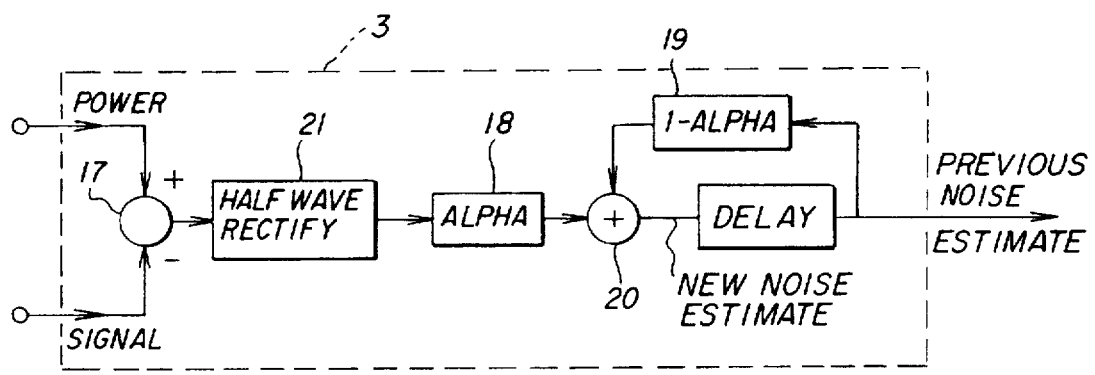
FIG. 5 is a diagrammatic view of a system for noise power estimation.

This noise estimator is depicted in FIG. 5. The difference between the total power and the signal power is calculated at 17, it is then multiplied by alpha at 18. The previous noise estimate is multiplied by (1-alpha) at 19 and added in 20 to the output of multiplier 18. The two noise estimators described above differ from those previously used in that they make use of the signal estimate. Other forms of noise estimators can be used, including combinations of the above two methods.

Information Signal Detector

Figure 6:
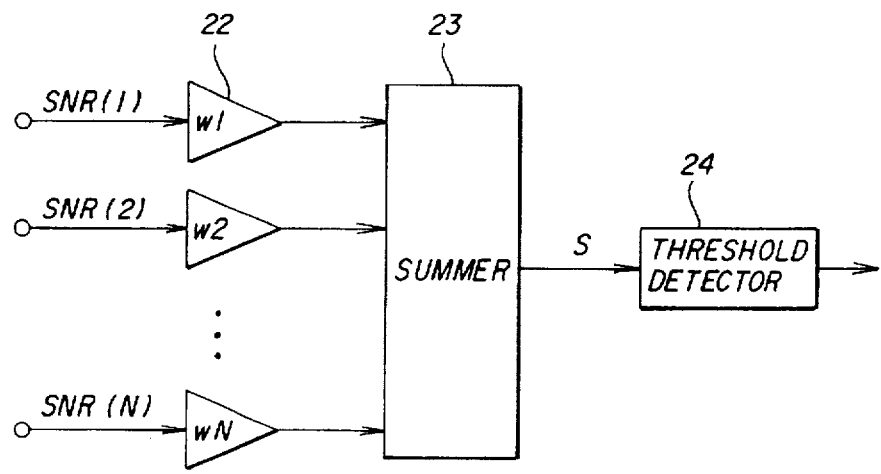
FIG. 6 is a diagrammatic view of an information signal detector.

The presence of an information signal can be detected by looking at a weighted sum of the signal to noise components across frequency bins (a uniform weighting may be used). If this weighted sum is above a predetermined threshold, the signal is assumed to contain information. This is shown in FIG. 6. the signal to noise ratios are weighted at 22 and then summed at 23 before being passed to the threshold detector 24.

A Particular Embodiment

One embodiment of the method is described below

--- at each update number k
   X = Fourier transform { x, window function, N }.
   FOR each frequency number f in speech band
      power = modulus squared{ X[f] }
      sig1 = maximum{power − noise[f], 0}
      sig2 = modulus squared{Y[f]}
      signal = (1−beta) * sig1 + beta * sig2
      W = signal/( noise[f] + signal )
      snr = W * (power /noise[f] )
      C = F{snr} / ( power /noise[f] )
      temp = alpha*(old_power[f] − signal)
      noise = (1−alpha) * noise +
         alpha * sign{temp}*minimum{abs(temp),noise/2}
      old_power[f] = power
      Y[f] = C * X[f]
   ENDFOR
   $y_k(1:N)$ = inverse Fourier transform {Y,N}
   $y_k(1:N/2) = y_k(1:N/2) + y_{k-1}(N/2+1:N)$

---

At the end of each iteration, k, the signal $y_k(1:N/2)$ provides an estimate of the information signal.

We claim:

1. A method for estimating the frequency components of an information signal from an input signal containing both the information signal and noise, said method comprising:

a means to produce a set of input frequency components, one for each frequency band and for each frequency component;

calculating the total power in each input frequency component;

estimating the power of the information signal included therein;

calculating a modified gain for each frequency band as a function of the total power, the estimate of the power of the information signal and a previous estimate of a noise power;

multiplying the input frequency component by said modified gain to thereby produce an estimate of the power of the frequency component of said information signal; and estimating a new noise power estimate from the previous estimate of the noise power and the difference between the total power in the input frequency component and the estimate of the power of the frequency component of said information signal, wherein estimating the new noise power estimate occurs regardless of whether there is a pause in the infornation signal.

2. A method as in claim 1, in which the gain in each frequency band is determined by the steps of:

estimating a Wiener gain from said previous noise power estimate and the estimate of the power of the information signal;

multiplying said Wiener gain by the ratio of the power of the input frequency component to the estimated noise power to produce an estimate of the signal to noise ratio;

calculating a function of the estimated signal to noise ratio; and dividing said function of the estimated signal to noise ratio by the ratio of the power of the input frequency component to the estimated noise power to thereby produce a modified gain.

3. A method as in claim 1 and including the step of estimating the overall signal to noise ratio from a weighted sum of the estimated signal to noise ratios in each frequency band.

4. A method as in claim 3 and including the step of using said estimated overall signal to noise ratio to determine the presence of an information signal in the input signal.

5. A method as in claim 3, wherein the new noise power estimate is compared to a threshold value to determine the presence of the information signal.

6. A method as in claim 1 and including the step of recombining the estimates of the frequency components of said information signal to produce a noise reduced output signal.

7. A method as in claim 6 which is used for reducing noise in a communications system.

8. A method as in claim 1 in which the filtering is performed via a Fourier transform.

9. A method as in claim 1 which is used as a preprocessor to a speech or voice recognition system.

10. A method as in claim 1 in which the power of the information signal is estimated from a combination of the previous estimate of the frequency components of said information signal and the positive difference between the power in the input frequency component and the noise power estimate.

11. The method of claim 1, wherein said means to produce a set of input frequency components comprises filtering the input signal through a set of band pass filters.

12. The method of claim 1, wherein said means to produce a set of input frequency components comprises calculating the Fourier Transform of the input signal.

13. A system for estimating the noise power ofl frequency components of an information signal from an input signal containing both the information signal and noise, said system comprlsing:

means to produce a set of input frequency components, one for each frequency band and for each frequency component;

a first calculating means for calculating the total power in each input frequency component;

an estimating means for estimating the power of the information signal included therein;

a second calculating means for calculating a modified gain for each frequency band as a function of the total power, the estimate of the power of the information signal and a previous estimate of a noise power; and gain multiplying means for multiplying the input frequency component by said modified gain to thereby produce an estimate of the power of the frequency component of said information signal whereby said estimating means estimates a new noise power estimate from the previous estimate of the noise power and the difference between the total power in the input frequency component and the estimate of the power of the frequency component of said information signal, wherein estimating the new noise power estimate occurs regardless of whether there is a pause in the information signal.

14. A system as in claim 13 in which the second calculating means includes means for:

estimating a Wiener gain from said previous noise power estimate and the estimate of the power of the information signal;

Wiener multiplying means for multiplying said Wiener gain by the ratio of the power of the input frequency component to the estimated noise power to produce an estimate of the signal to noise ratio;

function calculating means for calculating a function of the estimated signal to noise ratio; and division means for dividing said function of the estimated signal to noise ratio by the ratio of the power of the input frequency component to the estimated noise power to thereby produce a modified gain.

15. The system of claim 13, wherein said means to produce a set of input frequency components is capable of filtering the input signal through a set of band pass filters.

16. The system of claim 13, wherein said means to produce a set of input frequency components is capable of calculating the Fourier Transform of the input signal.

* * * * *